(12) United States Patent
Kwong et al.

(10) Patent No.: US 8,072,721 B2
(45) Date of Patent: Dec. 6, 2011

(54) ESD PROTECTION USING A CAPACITIVLY-COUPLED CLAMP FOR PROTECTING LOW-VOLTAGE CORE TRANSISTORS FROM HIGH-VOLTAGE OUTPUTS

(75) Inventors: Kwok Kuen David Kwong, Davis, CA (US); Chik Wai David Ng, Hong Kong (HK); Wai Kit Victor So, Hong Kong (HK); Hing Kit Kwan, Hong Kong (HK)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 345 days.

(21) Appl. No.: 12/481,696

(22) Filed: Jun. 10, 2009

(65) Prior Publication Data

US 2010/0315748 A1    Dec. 16, 2010

(51) Int. Cl.
*H02H 9/00* (2006.01)
(52) U.S. Cl. .......................................................... 361/56
(58) Field of Classification Search .................. None
See application file for complete search history.

(56) References Cited

U.S. PATENT DOCUMENTS

| | | | | |
|---|---|---|---|---|
| 5,400,202 A | * | 3/1995 | Metz et al. | 361/56 |
| 6,118,640 A | * | 9/2000 | Kwong | 361/56 |
| 6,222,749 B1 | * | 4/2001 | Peron | 363/125 |
| 7,068,091 B1 | | 6/2006 | Kwong | |
| 7,289,308 B2 | | 10/2007 | Kimura | |
| 7,420,252 B2 | | 9/2008 | Wu et al. | |
| 7,589,944 B2 | * | 9/2009 | Mergens et al. | 361/56 |
| 7,894,170 B2 | * | 2/2011 | Liao et al. | 361/56 |
| 2006/0146457 A1 | * | 7/2006 | Lu et al. | 361/56 |
| 2006/0198069 A1 | | 9/2006 | Chuan et al. | |
| 2008/0128818 A1 | | 6/2008 | Chen et al. | |
| 2009/0040668 A1 | | 2/2009 | Chen et al. | |

* cited by examiner

*Primary Examiner* — Jared Fureman
*Assistant Examiner* — Terrence Willoughby
(74) *Attorney, Agent, or Firm* — Stuart T. Auvinen; gPatent LLC

(57) ABSTRACT

An electro-static-discharge (ESD) protection circuit protects core transistors. An internal node to the gate of an n-channel output transistor connects to the drain of an n-channel gate-grounding transistor to ground. The gate of the gate-grounding transistor is a coupled-gate node that is coupled by an ESD coupling capacitor to the output and to ground by an n-channel disabling transistor and a leaker resistor. The gate of the n-channel disabling transistor is connected to power and disables the ESD protection circuit when powered. An ESD pulse applied to the output is coupled through the ESD coupling capacitor to pulse high the coupled-gate node and turn on the gate-grounding transistor to ground the gate of the n-channel output transistor, which breaks down to shunt ESD current. The ESD pulse is prevented from coupling through a parasitic Miller capacitor of the n-channel output transistor by the gate-grounding transistor.

18 Claims, 8 Drawing Sheets

HIGH-V. ESD TURNS ON GG XTOR

LOW-V. ESD DISABLES GG XTOR, ESD COUPLED TO CORE

US 8,072,721 B2

ESD PROTECTION USING A CAPACITIVLY-COUPLED CLAMP FOR PROTECTING LOW-VOLTAGE CORE TRANSISTORS FROM HIGH-VOLTAGE OUTPUTS

FIELD OF THE INVENTION

This invention relates to electro-static-discharge (ESD) protection circuits, and more particularly to protection of core transistors from capacitivly-coupled ESD pulses.

BACKGROUND OF THE INVENTION

Small electronic devices such as integrated circuits (IC) are prone to damage and failure from electro-static-discharges (ESD). Various ESD-protection structures have been placed near input, output, or bi-directional I/O pins of ICs. Many of these protection structures use passive components such as series resistors, diodes, and thick-oxide transistors. Another type of ESD structure uses an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage and thus consume less power and produce less heat.

Such smaller transistors are often placed in an internal "core" of an IC, while larger transistors with gate lengths that are above the minimum are placed around the core in the periphery. ESD-protection structures are placed in the periphery using these larger transistors.

Although internal nodes of the smaller core transistors do not connect directly with Input-Output pads of the IC, the inventors have realized that parts of ESD pulses may be capacitivly coupled to internal core transistors, causing unexpected damage in the core, despite ESD-protection structures in the periphery.

Thinner gate oxides of the core transistors can be shorted, and substrate junctions melted by relatively small capacitivly-coupled currents applied to the tiny core devices. Static charges from a person or machinery can produce such damaging currents that are only partially blocked by the input-protection circuits in the periphery.

FIG. 1 is a prior-art mixed-voltage chip with an ESD-protection circuit. Core circuitry 20 contains core transistors 24, 26 which have a small channel length and can be damaged by voltages that were considered normal voltages a few years ago. Core circuitry 20 receives a reduced power supply voltage VDDi from voltage regulator 14, which steps down the external power supply VDDx to a voltage that can be safely applied to core transistors 24, 26 and other transistors in core circuitry 20. For example, VDDx may be 5 volts and VDDi may be 3 volts, 1.8 volts, 1.2 volts, or some other value. There may be thousands of core transistors in core circuitry 20.

Core transistors 24, 26 drive transistors in level shifter 18, which also receives VDDi from voltage regulator 14. Level shifter 18 raises the high-level output voltage produced by core transistor 24 using VDDi from voltage regulator 14. The boosted high voltage from level shifter 18 is then applied to the gate of p-channel output transistor 12, allowing the output pad to be driven to VDDx, which is applied to the source of p-channel output transistor 12. Level shifter 18 also drives the gate of n-channel output transistor 10 to allow the output to be driven low.

Protection from ESD pulses is provided by grounded-gate transistor 30, which is an n-channel transistor with its gate, source, and substrate connected to ground. Grounded-gate transistor 30 can turn on to shunt the ESD pulse to ground, either by normal channel conduction for a negative ESD pulse, or by drain-to-source breakdown (avalanche breakdown of the parasitic NPN transistor). A thicker field-oxide may be used for the gate oxide of grounded-gate transistor 30 rather than the more damage-prone thin gate oxide.

When grounded-gate transistor 30 turns on, by shunting current to ground it can keep the voltage at the drains of output transistors 10, 12 below their breakdown voltage, protecting them as well as core circuitry 20 which are further protected by output transistors 10, 12 and level shifter 18. Thus core transistors 24, 26 in core circuitry 20 are well-protected.

Smaller gate lengths and device sizes are used for core transistors 24, 26 and others in core circuitry 20 while larger gate lengths and device sizes are used for output transistors 10, 12 and for grounded-gate transistor 30. The larger devices are less prone to ESD damage.

FIG. 2 shows a prior-art open drain chip. Rather than use push-pull output circuits that drive outputs both high and low, only a pull-down output driver may be used. A pull-up resistor can be added to the output, either on-chip or off-chip. Since n-channel output transistor 10 drives much more current than the pull-up transistor sources, when n-channel output transistor 10 turns on, node OUTPAD and the output pad are driven low. When n-channel output transistor 10 turns off, node OUTPAD and the output pad gradually rise in voltage due to the pull-up resistor.

Since there is no p-channel output transistor for the open-drain output, there is no need of level shifter 18 of FIG. 1. Core transistors 24, 26 can directly drive the gate of n-channel output transistor 10. Although voltage regulator 14 provides only VDDi to core circuitry 20, and thus the gate of n-channel output transistor 10 is driven high to VDDi rather than to VDDx, VDDi is sufficiently high to turn on n-channel output transistor 10 and drive the output low, although somewhat more slowly that if VDDx were applied.

ESD protection is still provided by grounded-gate transistor 30. However, with the absence of level shifter 18, core circuitry 20 is separated from output node OUTPAD by only the gate of n-channel output transistor 10.

ESD Failures of Core Transistors

The inventors have noticed that these kinds of open-drain chips are more susceptible to ESD damage than push-pull outputs such as shown in FIG. 1. While n-channel output transistor 10 has a larger gate length and does not get damaged by typical ESD pulses, core transistors 24, 26 use smaller gate lengths and other feature sizes and have been found to fail when n-channel output transistor 10 does not.

Protection for Standard ESD Pulses—FIGS. 3A-C

Static electricity that normally builds up on a person can discharge across the input pins or a semiconductor integrated circuit (IC or chip). IC chips are routinely tested for resistance to such electro-static-discharges (ESD) using automated testers that apply a voltage across different pairs of pins of the chip. Any pair of pins may be chosen for the ESD test. FIGS. 3A-C highlight normal, successful operation of an ESD-Protection circuit.

In FIG. 3A, grounded-gate transistor 30 is turned off during normal operation with typical power-supply and ground voltages. However, when a positive ESD pulse is applied between the pad (node OUTPAD) and ground, the large drain-to-source voltage causes avalanche breakdown to occur under the gate of grounded-gate transistor 30, and grounded-gate transistor 30 conducts current under its gate to ground through the parasitic NPN transistor. Other breakdown mechanisms may occur in grounded-gate transistor 30. However, the ESD pulse must produce a sufficiently high voltage on node OUTPAD to initiate this breakdown. Once breakdown begins, and the current flows from node OUTPAD to ground, a snap-back effect can occur wherein grounded-gate transistor 30 continues conducting at voltages that are less than the initial breakdown voltage. The current shunted through grounded-gate transistor 30 quickly reduces the voltage on node OUTPAD, protecting core circuitry 20.

VDDi is generated by voltage regulator 14 using comparator 28 to compare VDDi to a reference voltage Vref and adjust the resistance of regulator transistor 22.

FIG. 3B shows a graph of the voltage on node OUTPAD over time as an ESD pulse is applied, while FIG. 3C shows that internal node NG has a lower voltage pulse that is coupled by parasitic Miller capacitor 32 from node OUTPAD to node NG. Capacitor 32 is formed from the gate-to-drain overlap of n-channel output transistor 10 and can be substantial when n-channel output transistor 10 is a large transistor designed to drive a large external load. This Miller capacitance is considered parasitic, and other parasitic capacitances may be included in capacitor 32.

Grounded-gate transistor 30 is designed to pass industry-standard ESD tests. These tests generate ESD pulses based on models such as the ESD machine model, which creates the ESD pulse by discharging a 200-pF capacitor that was charged to 100-400 volts, or the ESD human-body model, which creates the ESD pulse by discharging a 100-pF capacitor that was charged to 1000-4000 volts. The human-body model discharges the capacitor through a 1.5 k-ohm resistor, which limits the peak current in the pulse but extends the duration of the pulse.

Since the current of both the ESD human model (HBM) and the machine model (MM) are discharged from a small 100 or 200 pF capacitor, the duration of the discharged current is very short.

Protection Fails for Non-Standard ESD Pulses—FIGS. 4A-C

However, some real-world ESD pulses are longer in duration and/or lower in voltage than the HBM. Core transistor 26 in core circuitry 20 can be burned out by electro-over-stress (EOS) pulses that are low voltage but higher current (100 ma above) with long duration. These kinds of pulses can be generated in real-world hot-swap interfaces for telecom and datacom applications.

FIGS. 4A-C highlight failure of an ESD-Protection circuit when a non-standard ESD pulse occurs. When the ESD pulse is of longer duration than for the HBM, the peak voltage created by the ESD pulse may be reduced. Sometimes the ESD pulse has a lower voltage that what is created by the HBM or a standard ESD testing machine.

It is surprising that a lower-voltage ESD pulse could cause failures when a higher-voltage ESD pulse protects against failures. It is counter-intuitive that a lower voltage causes failures when a higher voltage does not. However, the inventors have observed this unusual phenomenon.

In FIG. 4A, damage is seen in core transistor 26 when n-channel output transistor 10 and grounded-gate transistor 30 do not show damage. This core damage occurs when a lower-voltage ESD pulse such as that shown in FIG. 4B is applied to the pad and node OUTPAD compared to FIG. 3B, when the standard ESD pulse is applied, producing a higher voltage on node OUTPAD.

The inventors theorize that the lower voltage applied to node OUTPAD by the sub-standard ESD pulse is below the breakdown voltage and thus insufficient to turn on grounded-gate transistor 30. It is also possible that grounded-gate transistor 30 does eventually turn on, but later than usual, allowing time for core transistor 26 to be damaged.

The lower-voltage pulse on node OUTPAD prevents or delays turn-on of grounded-gate transistor 30, so no current is shunted to ground. Instead, the voltage on node OUTPAD rises and this rise in voltage is capacitivly coupled through parasitic Miller capacitor 32 to node NG.

The rise in voltage of node NG may seem to be small, but the small device sizes of core transistors 24, 26 may be quite sensitive to voltages above VDDi. This slight voltage rise on node NG may be sufficient to damage core transistors 24, 26 as observed by the inventors.

FIG. 4C shows that the voltage of internal node NG rises slightly higher and for a longer period of time than for the standard ESD pulse test of FIG. 3C. The exact voltages of internal node NG are not known but are here theorized by the inventors.

The amount that the voltage of node NG rises compared with the rise of node OUTPAD depends on the capacitive coupling ratio of parasitic Miller capacitor 32. When n-channel output transistor 10 is large, parasitic capacitor 32 is also large, while drain capacitances of core transistors 24, 26 may be much smaller. This combination produces a relatively large coupling ratio, increasing the voltage of the pulse on node NG.

FIGS. 5A-D are graphs comparing operating conditions for standard high-voltage ESD tests and sub-standard lower-voltage ESD tests. A standard ESD test is shown in FIGS. 5A-B.

FIG. 5A shows a current-voltage curve. As the ESD pulse is applied to the pad at node OUTPAD, initially grounded-gate transistor 30 is turned off so the current is low as the voltage rises from the origin. Once the voltage is above the avalanche breakdown voltage VTO, current increases dramatically as the voltage is reduced (snaps back) as current flow continues to increase. Core transistor 26 likewise conducts in a snap-back mode once the ESD pulse is coupled through parasitic Miller capacitor 32 to its drain. The current through core transistor 26 is much less than through grounded-gate transistor 30.

FIG. 5B shows a voltage-time plot of the pad node and internal nodes when the standard ESD pulse is applied. The ESD pulse raises the voltage of pad node OUTPAD to a high level that is above the breakdown voltage VTO. Some of this voltage rise is coupled through parasitic Miller capacitor 32 to the drain of core transistors 24, 26. However, once grounded-gate transistor 30 turns on, the voltage pulse on node OUTPAD drops quickly, cutting the width of the pulse on internal node NG. If grounded-gate transistor 30 turns on quickly enough, the pulse on internal node NG does not have time to reach higher voltages that could damage core transistors 24, 26. The voltage stays below the avalanche breakdown voltage of core transistors 24, 26, VTC.

FIG. 5C shows a current-voltage curve when a lower voltage pulse is applied. As the sub-standard ESD pulse is applied to the pad at node OUTPAD, initially grounded-gate transistor 30 is turned off so the current is low as the voltage rises from the origin. Once the voltage is above the breakdown voltage, current increases as the voltage is reduced (snaps back) as current flow continues to increase. However, grounded-gate transistor 30 turns on more slowly with the lower ESD pulse. Core transistor 26 turns on earlier than for FIG. 5A and snaps-back once the ESD pulse is coupled through parasitic Miller capacitor 32 to its drain. Since core transistor 26 has a shorter gate length than does grounded-gate transistor 30, it snaps back more dramatically as seen in FIG. 5C. The current through core transistor 26 is much closer to that than through grounded-gate transistor 30 in FIG. 5C than in FIG. 5A.

FIG. 5D shows a voltage-time plot of the pad node and internal nodes when the sub-standard ESD pulse is applied. The sub-standard ESD pulse raises the voltage of pad node OUTPAD to a moderate level that is initially below the breakdown voltage VTO. Some of this voltage rise is coupled through parasitic Miller capacitor 32 to the drain of core transistors 24, 26. Node NG reaches a higher voltage level in FIG. 5D than in FIG. 5B since grounded-gate transistor 30 is delayed in turning on by the sub-standard ESD pulse. The voltage rises above the avalanche breakdown voltage of core transistors 24, 26, VTC. The higher NG voltage and its longer duration breaks down core transistor 26, causing irreversible damage to core circuitry 20 when the voltage at node NG exceeds the core transistors' second breakdown voltage.

Once grounded-gate transistor 30 turns on, the voltage pulse on node OUTPAD drops, cutting the width of the pulse on internal node NG. However, since grounded-gate transistor 30 turns on too slowly, or never turns on, the pulse on internal node NG was wider in duration and had time to reach higher voltages that damage core transistors 24, 26. Thus the wider, longer NG pulse in FIG. 5D compared with FIG. 5B is thought to cause the damage seen on core transistor 26. After avalanche breakdown occurs, thermal runaway breakdown can next occur, causing permanent damage.

What is desired is an electro-static-discharge (ESD) protection circuit that can protect against damage from sub-standard ESD pulses. An improved ESD protection circuit that protects against both high and lower-voltage ESD pulses is desirable.

BRIEF DESCRIPTION OF THE DRAWINGS

FIGS. 4A-C highlight failure of an ESD-Protection circuit when a non-standard ESD pulse occurs.

DETAILED DESCRIPTION

The present invention relates to an improvement in ESD protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have observed damage to core transistors while no damage occurs to periphery transistors in outputs and ESD protection circuits. Thus the ESD protection circuits are failing to protect the internal core circuits. This is especially observed for open-drain outputs that lack a level shifter.

Figure 6:
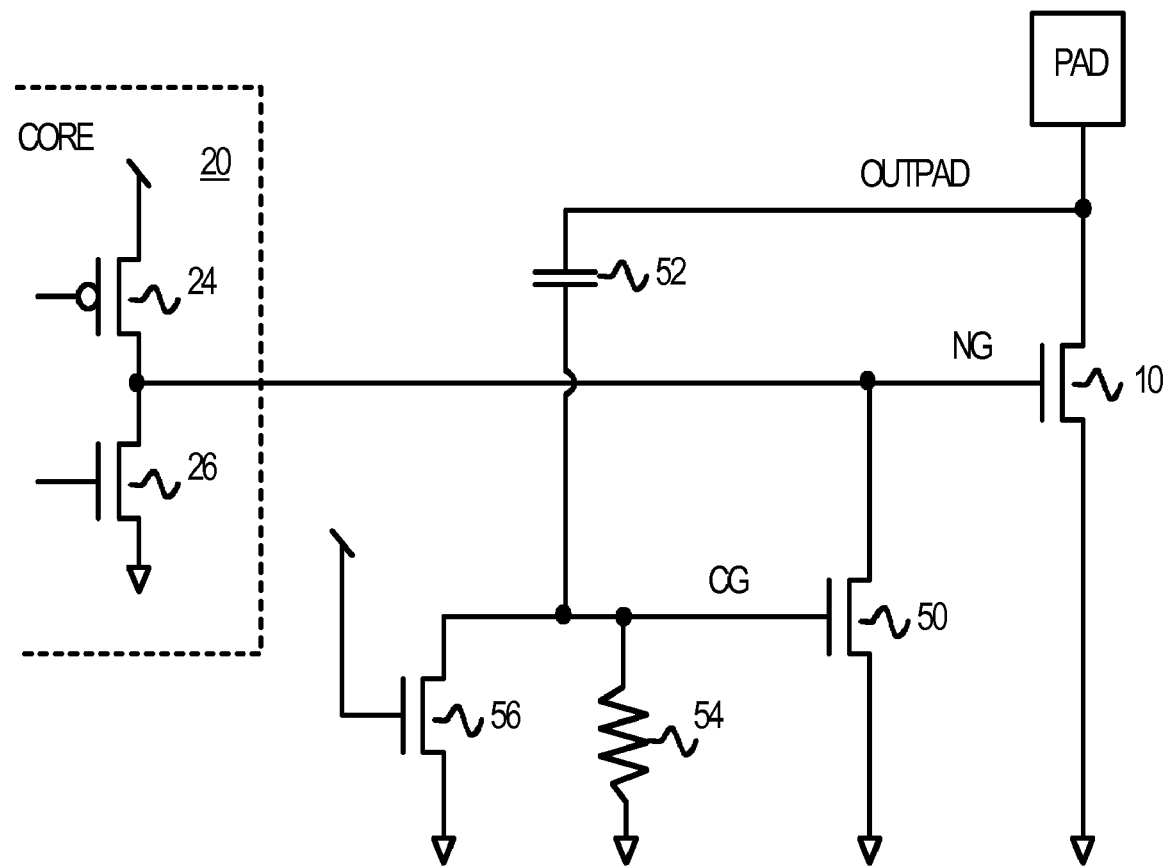
FIG. 6 is a schematic of a capacitivly-coupled ESD-protection circuit.

FIG. 6 is a schematic of a capacitivly-coupled ESD-protection circuit. Core transistors 24, 26 in core circuitry 20 driven node NG to the gate of n-channel output transistor 10, which drives the output pad, node OUTPAD. Open-drain outputs are more prone to allow damage to core transistors.

Rather than use a grounded-gate transistor in parallel with n-channel output transistor 10, n-channel output transistor 10 acts as both the output transistor and as the ESD-protection transistor.

During normal operation, coupled-gate node CG is driven to ground by n-channel disabling transistor 56, which has either VDDi or VDDx applied its gate. Thus n-channel disabling transistor 56 is normally on when power is applied, causing node CG to be actively grounded. Grounding resistor 54 also pulls node CG to ground, although at a lower rate than n-channel disabling transistor 56.

Since coupled-gate node CG is grounded during normal powered operation, the gate of gate-grounding transistor 50 is actively grounded. Gate-grounding transistor 50 is thus turned off during normal operation.

When power is disconnected, the gate of n-channel disabling transistor 56 leaks to ground, turning off n-channel disabling transistor 56. When an ESD pulse is applied to the pad, node OUTPAD, then the rise in voltage on node OUTPAD is coupled by ESD coupling capacitor 52 to coupled-gate node CG. ESD coupling capacitor 52 causes the voltage of coupled-gate node CG to rise until the gate-to-source voltage of gate-grounding transistor 50 is more than a transistor threshold, about 0.7 volts. Then gate-grounding transistor 50 turns on, discharging internal node NG to ground. Since the gate of n-channel output transistor 10 is now grounded, it acts as grounded-gate transistor 30 of FIG. 2.

When the ESD pulse has a voltage above the breakdown voltage of n-channel output transistor 10, then n-channel output transistor 10 breaks down and conducts the ESD current to ground.

However, when the ESD pulse is sub-standard, the voltage on pad node OUTPAD is less than the breakdown, and n-channel output transistor 10 does not turn on. Some of the voltage rise on pad node OUTPAD can be coupled through parasitic Miller capacitor 32 to internal node NG. However, since gate-grounding transistor 50 is turned on, any rise in voltage on internal node NG is quickly shunted to ground as current flows through gate-grounding transistor 50 to ground. Thus a large or a long duration voltage rise on internal node NG is prevented by gate-grounding transistor 50, which is turned on by the ESD pulse coupling through ESD coupling capacitor 52.

Figure 7:
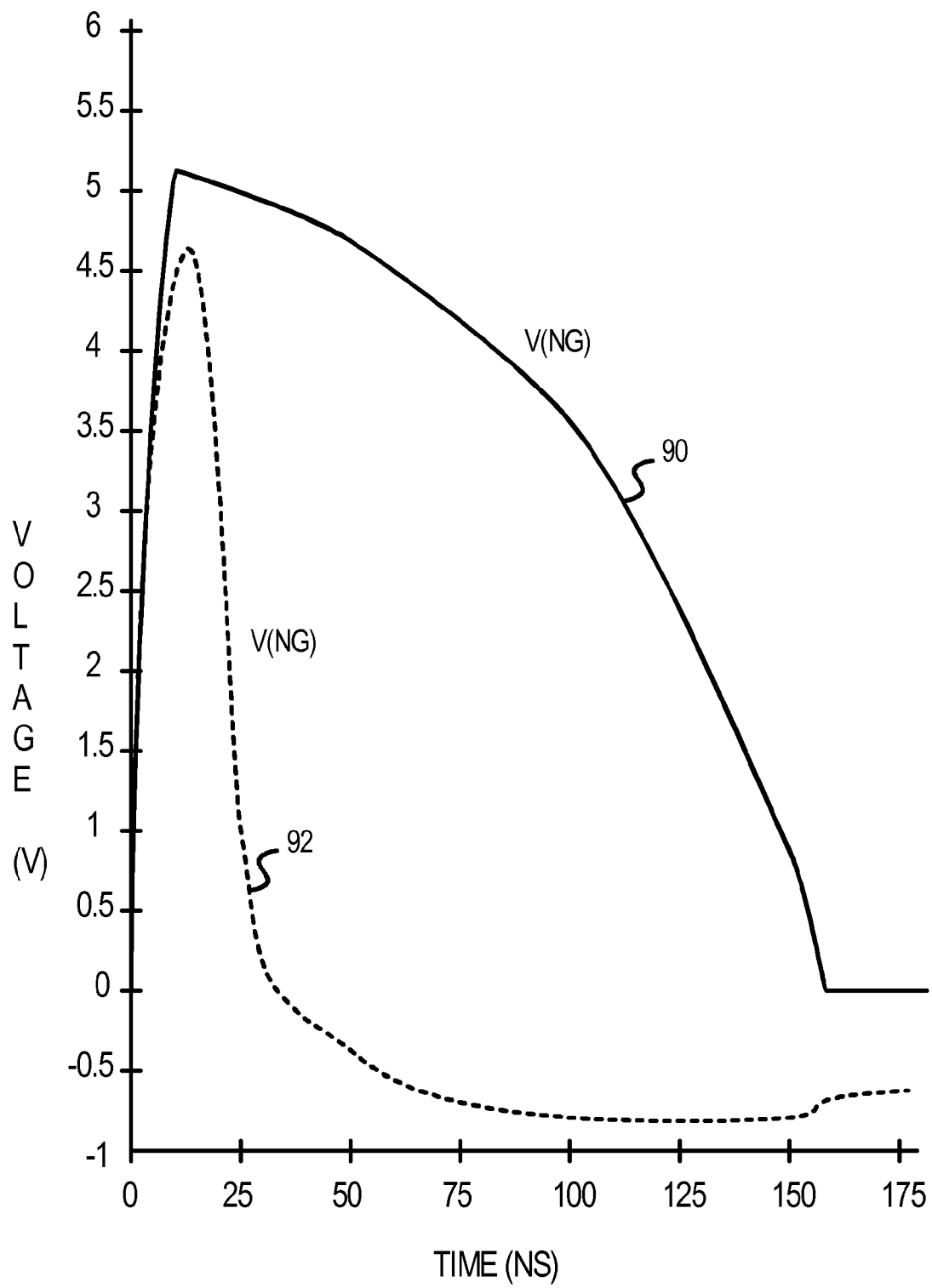
FIG. 7 is a graph of the voltage on the internal node NG both with and without the protection circuit of FIG. 6.

FIG. 7 is a graph of the voltage on the internal node NG both with and without the protection circuit of FIG. 6. A sub-standard ESD pulse is simulated and applied to the pad node OUTPAD.

Figure 1:
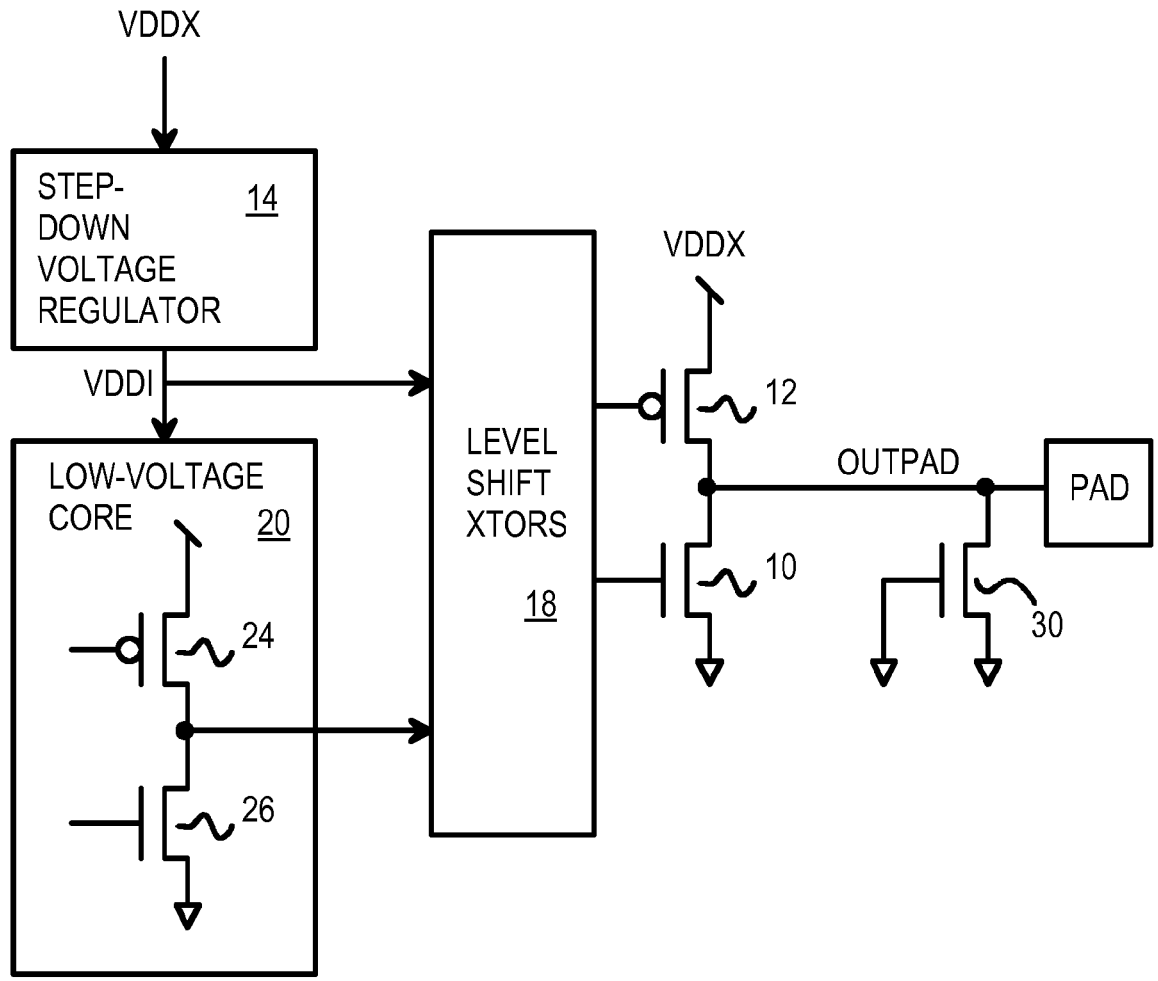
FIG. 1 is a prior-art mixed-voltage chip with an ESD-protection circuit.
Figure 2:
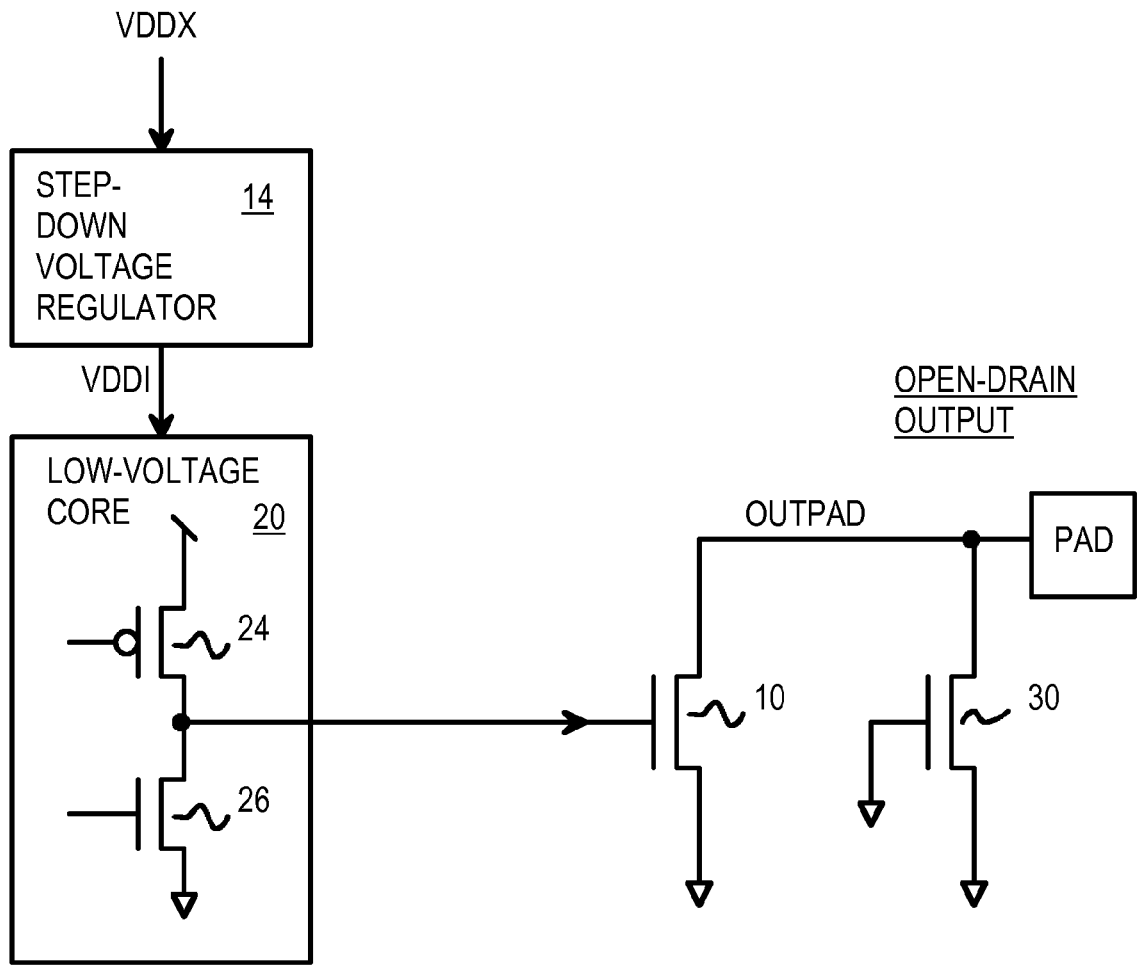
FIG. 2 shows a prior-art open drain chip.
Figure 3A:
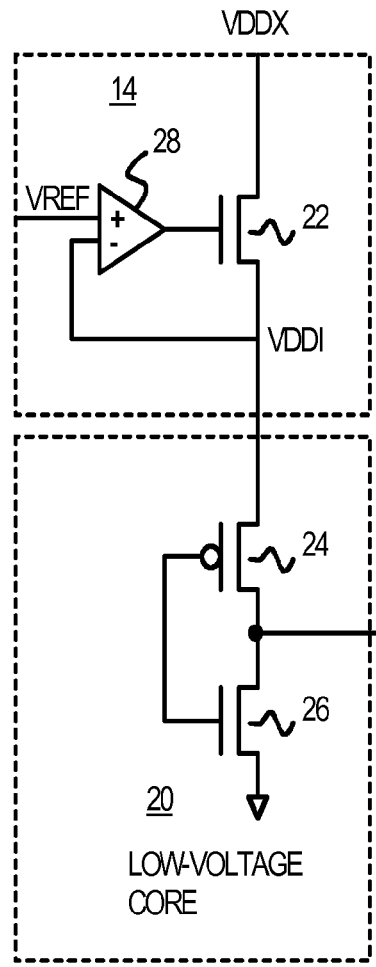
FIGS. 3A-C highlight normal, successful operation of an ESD-Protection circuit.
Figure 3A:
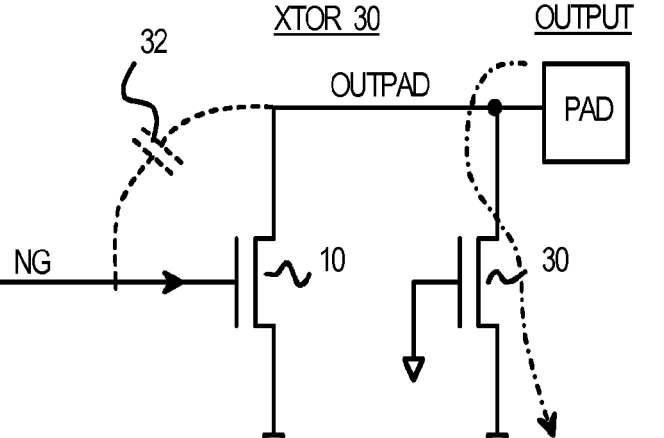
Figure 3C:
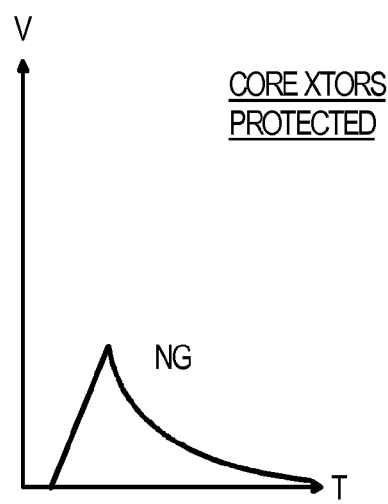
Figure 3B:
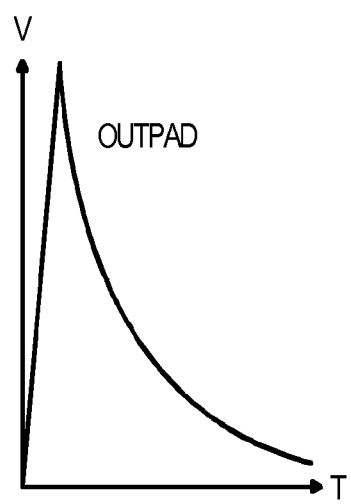
Figure 4C:
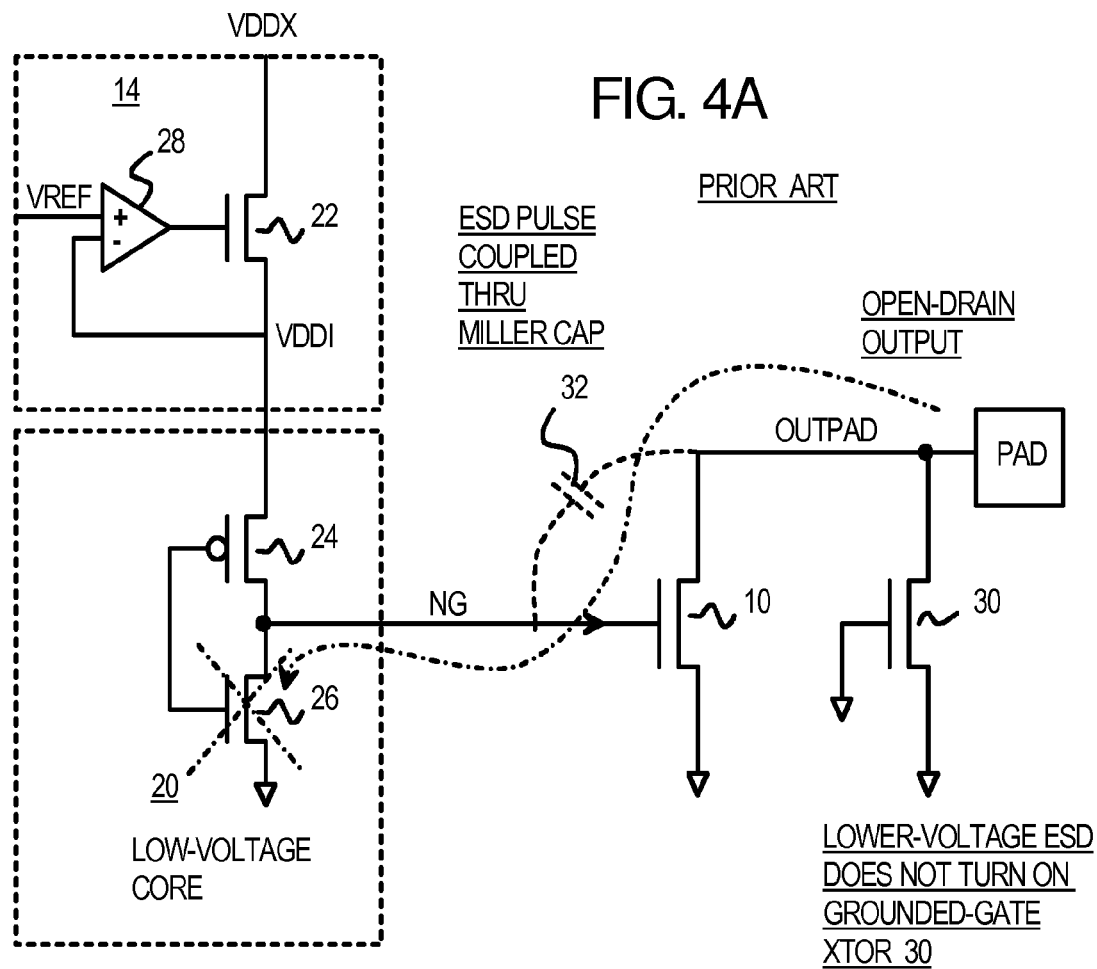
Figure 4C:
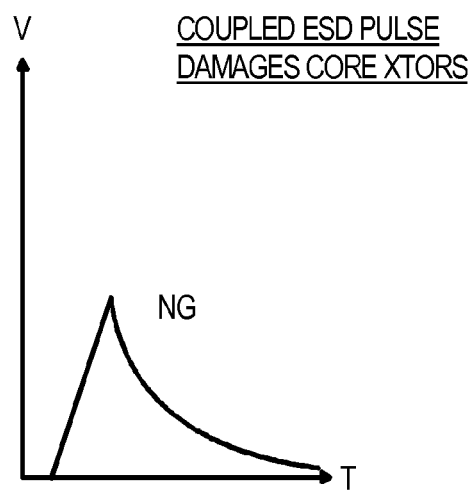
Figure 4B:
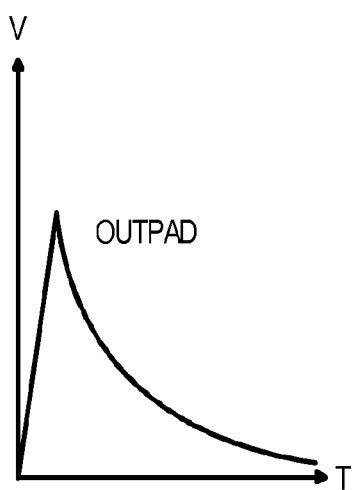
Figure 5A:
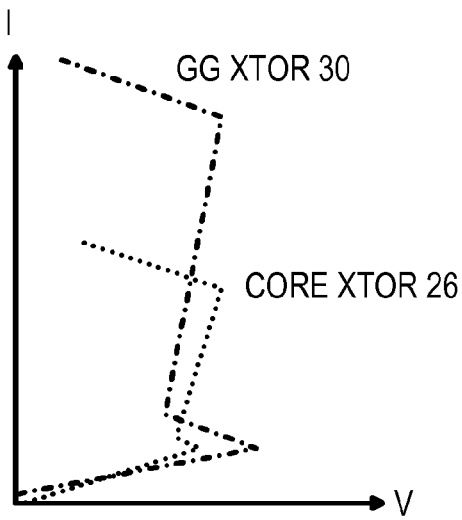
FIGS. 5A-D are graphs comparing operating conditions for standard high-voltage ESD tests and sub-standard lower-voltage ESD tests.
Figure 5B:
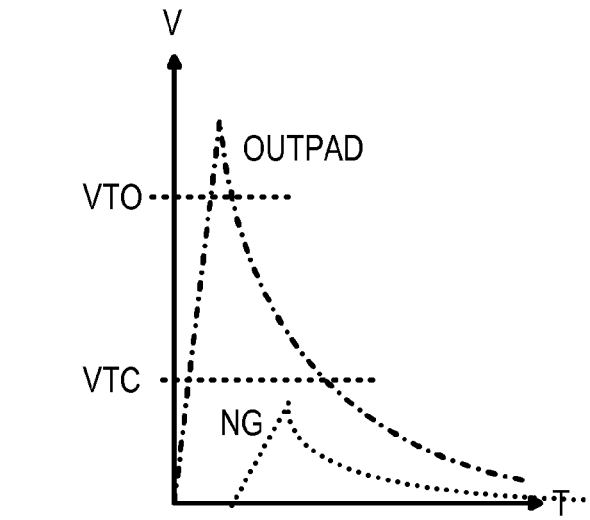
Figure 5C:
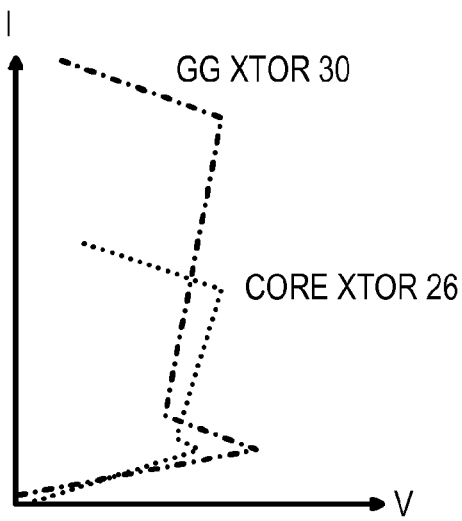
Figure 5D:
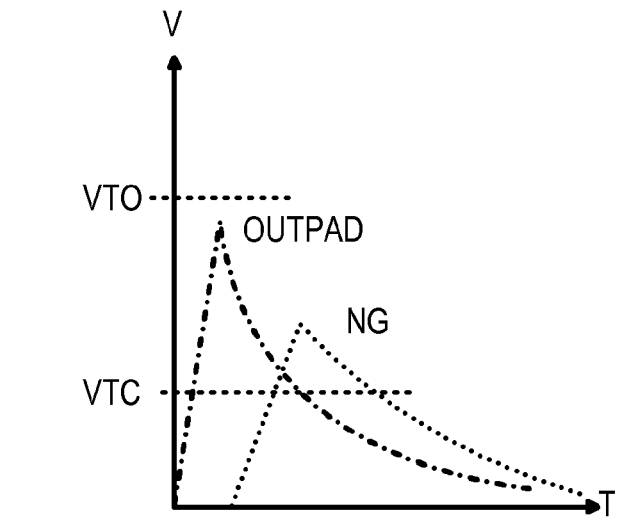

Curve 90 shows the voltage of internal node NG when the prior-art circuit of FIG. 2 is used. The internal node voltage rise to just above 5 volts, but has a broad area and remains above 3 volts for over 100 nanoseconds (ns). Although the voltage is not that high, the long duration above VDDi allows damage to occur to core circuitry.

Curve 92 shows the voltage of internal node NG when the capacitivly-coupled ESD-protection circuit of FIG. 6 is simulated. The peak voltage of internal node NG still reaches almost 5 volts, but the peak is of short duration. The internal node voltage quickly falls off to below 3 volts in about 20 ns. Gate-grounding transistor 50 turns on quickly to discharge internal node NG to ground.

The voltage of internal node NG may even go negative as shown. This can occur when gate-grounding transistor 50 turns off as internal node NG falls below threshold (about 0.5 volts). When the ESD pulse on pad node OUTPAD is still falling, this falling voltage is coupled by ESD coupling capacitor 52 to coupled-gate node CG. The falling voltage on coupled-gate node CG is coupled through the gate-to-drain Miller capacitance of gate-grounding transistor 50 to lower the voltage of internal node NG to below ground. Eventually resistor 54 or diffusion leakages return the voltage of coupled-gate node CG and internal node NG to ground.

Figure 8:
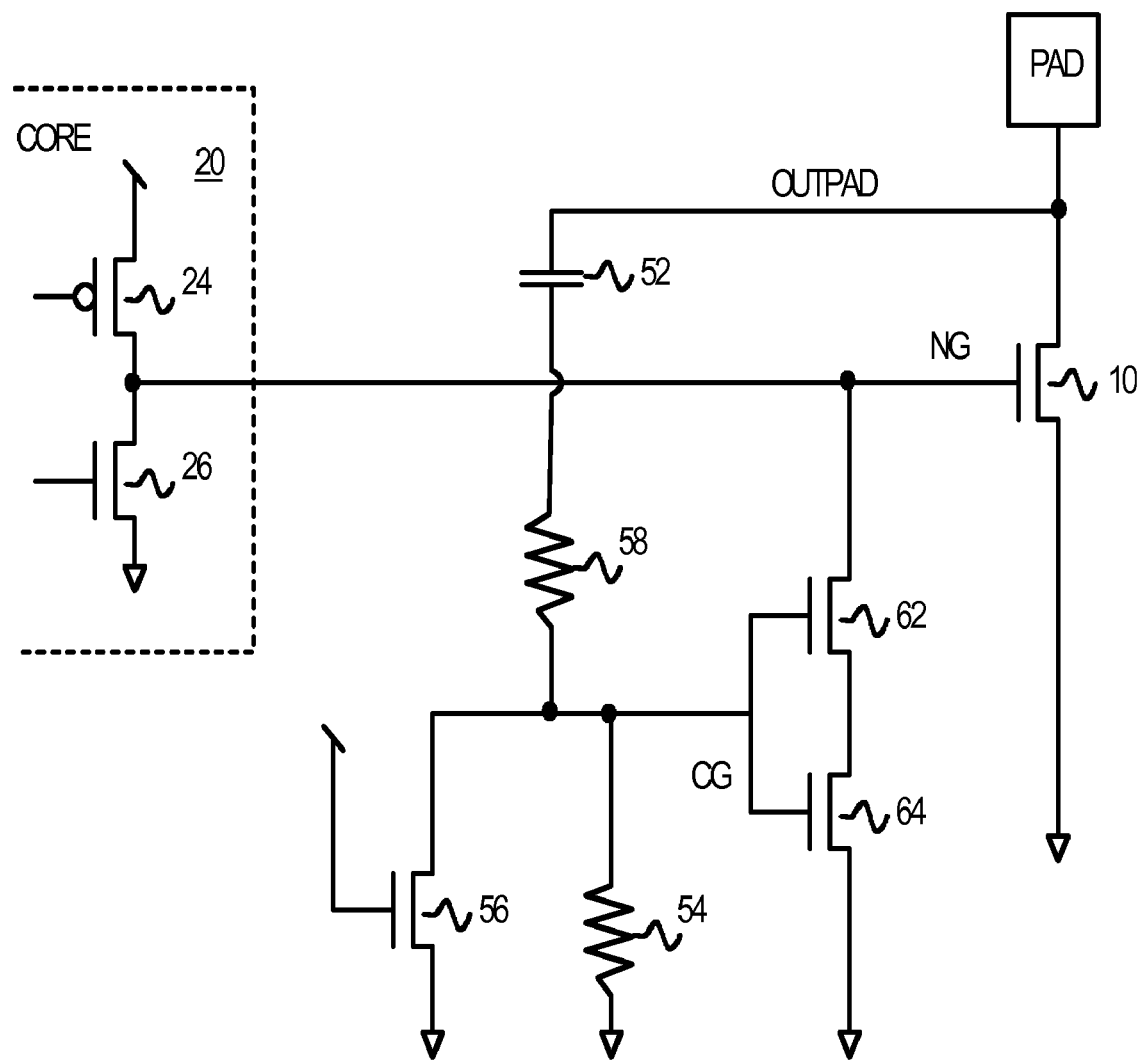
FIG. 8 is a schematic diagram of an alternate capacitivly-coupled ESD-protection circuit.

FIG. 8 is a schematic diagram of an alternate capacitivly-coupled ESD-protection circuit. In this alternate embodiment, two transistors 62, 64 have their channels in series between internal node NG and ground, and each receive coupled-gate node CG on their gates. Having two transistors in series can improve performance by increasing breakdown voltages and reducing leakage from internal node NG during normal operation. The higher effective breakdown voltage of the stack of transistors reduces the likelihood of thermal breakdown and physical damage.

Series resistor 58 is connected between ESD coupling capacitor 52 and coupled-gate node CG. Series resistor 58 creates an R-C delay to charging coupled-gate node CG during an ESD pulse and filters ground noise during normal operation. Resistors 58, 54 form a resistor voltage divider that reduces the voltage on coupled-gate node CG when an ESD pulse is coupled through ESD coupling capacitor 52. This stepped-down ESD pulse may prevent damage to gate-grounding transistor 50 or n-channel disabling transistor 56.

These alternatives may be combined as shown or used separately or in other combinations.

Alternate Embodiments

Several other embodiments are contemplated by the inventors. For example n-channel disabling transistor 56 can be replaced by a buffer with its input tied to VDDi or VDDx. While complementary metal-oxide-semiconductor (CMOS) transistors have been described, other kinds of transistors could be used, such as n-channel only, p-channel only, or various alternate transistor technologies.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 24, 26 has been shown, more complex gates and interconnections may drive the internal node, and there can be several internal nodes to different output pads. The output pads may be connected to an input buffer, test-scan logic, and other circuits.

A p-channel shunt transistor may be used rather than n-channel shunt transistor when an additional inversion is provided. Additional leaker devices such as resistors and small transistors could be added. Parasitic capacitances and resistances may be used from some components, depending on the process and device sizes used.

The ESD-protection circuit can be combined with other input-protection circuits, such as a Vcc-to-ground ESD protection circuit, or a series-resistor protection circuit to the gate of an input buffer. Grounded-gate and thick oxide protection transistors and diodes can also be added at various points to increase ESD protection.

The large output driver transistors also act as large diodes for some of the ESD tests and conditions. For example, when the ESD pulse is applied across the I/O pad and the power-supply pad, a positive ESD pulse can turn on the parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse.

The background of the invention section contains background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A capacitivly-coupled electro-static-discharge (ESD) protection circuit comprising:

core circuitry having transistors that use a minimum transistor gate length and drive an internal node;
an output transistor having a gate driven by the internal node from the core circuitry;
an output pad on a pad node connected to a source/drain of the output transistor;
an ESD coupling capacitor coupled between the pad node and a coupled-gate node;
a gate-grounding transistor having a gate connected to the coupled-gate node and a source/drain connected to the internal node; and
a disabling transistor having a source/drain connected to the coupled-gate node, for driving a disabling voltage onto the coupled-gate node when power is applied;
wherein the disabling voltage disables the gate-grounding transistor from conducting current from the internal node;
wherein the gate-grounding transistor turns on to shunt charge coupled across a parasitic Miller capacitance of the output transistor when an ESD is applied to the pad node,
whereby ESD protection of the core circuitry is provided.

2. The capacitivly-coupled ESD protection circuit of claim 1 wherein the disabling voltage on the coupled-gate node is a ground voltage.

3. The capacitivly-coupled ESD protection circuit of claim 2 further comprising:
a leaker resistor connected between the coupled-gate node and the ground voltage.

4. The capacitivly-coupled ESD protection circuit of claim 3 wherein the gate-grounding transistor is an n-channel transistor having a source connected to the ground voltage.

5. The capacitivly-coupled ESD protection circuit of claim 4 wherein the disabling transistor is an n-channel transistor having a gate driven by a power supply voltage and a source connected to the ground voltage;
wherein the output transistor is an n-channel transistor having a source connected to the ground voltage.

6. The capacitivly-coupled ESD protection circuit of claim 5 wherein the output transistor, the gate-grounding transistor, and the disabling transistor each have a larger transistor gate length that is greater than the minimum transistor gate length of the core circuitry,
whereby a breakdown voltage of transistors with the larger transistor gate length is higher than a breakdown voltage of transistors with the minimum transistor gate length,
whereby larger transistor devices are used outside of the core circuitry to increase breakdown voltages.

7. The capacitivly-coupled ESD protection circuit of claim 1 further comprising:
a series resistor;
wherein the ESD coupling capacitor is connected in series with the series resistor, wherein the ESD coupling capacitor and the series resistor are coupled between the pad node and the coupled-gate node.

8. The capacitivly-coupled ESD protection circuit of claim 7 wherein the series resistor is coupled between the ESD coupling capacitor and the coupled-gate node.

9. The capacitivly-coupled ESD protection circuit of claim 8 wherein the gate-grounding transistor comprises:
an upper transistor having an upper source/drain connected to the internal node, a gate connected to the coupled-gate node, and a lower source/drain connected to an intermediate node;
a lower transistor having an upper source/drain connected to the intermediate node, a gate connected to the coupled-gate node, and a lower source/drain connected to the ground voltage,
whereby the gate-grounding transistor is a split transistor.

10. A protection circuit comprising:
an output pad for connecting to external devices;
output transistor means for sinking current from the output pad in response to an internal node driving an output gate of the output transistor means;
gate-grounding transistor means for grounding the output gate of the output transistor means in response to a coupled-gate node;
disabling transistor means for grounding the coupled-gate node when power is applied to a gate of the disabling transistor means; and
coupling capacitor means for coupling a portion of a voltage rise on the output pad to the coupled-gate node to generate an enabling voltage on the coupled-gate node that causes the gate-grounding transistor to ground the output gate;
wherein core transistor coupled to the internal node are protected from coupling of the voltage rise on the output pad through the output transistor means.

11. The protection circuit of claim 10 further comprising:
disabling resistor means for leaking charge from the coupled-gate node to ground.

12. The protection circuit of claim 10 wherein the output transistor means is an n-channel transistor having a source connected to ground;
wherein the gate-grounding transistor means is an n-channel transistor having a source connected to ground;
wherein the disabling transistor means is an n-channel transistor having a source connected to ground and a gate connected to power.

13. The protection circuit of claim 10 further comprising:
series resistor means for increasing a resistance between the coupling capacitor means and the coupled-gate node.

14. The protection circuit of claim 10 wherein the gate-grounding transistor means further comprises:
upper transistor means for conducting current from the internal node to an intermediate node in response to a gate connected to the coupled-gate node;
lower transistor means for conducting current from the intermediate node to ground in response to a gate connected to the coupled-gate node.

15. The protection circuit of claim 10 further comprising:
parasitic Miller capacitor means for capacitivly and parasitically coupling the output pad to the internal node.

16. The protection circuit of claim 15 wherein the parasitic Miller capacitor means comprises a gate-to-drain capacitance in the output transistor means.

17. The protection circuit of claim 16 wherein the gate-grounding transistor means is further for shunting charge coupled to the internal node through the parasitic Miller capacitor means when an electro-static-discharge (ESD) pulse is applied to the output pad.

18. The protection circuit of claim 10 wherein the output pad is an open drain having no pull-up transistor.

* * * * *